United States Patent
Pandey et al.

(10) Patent No.: US 10,544,330 B2
(45) Date of Patent: Jan. 28, 2020

(54) GAP FILLING DIELECTRIC MATERIALS

(71) Applicant: Honeywell International Inc., Morris Plains, NJ (US)

(72) Inventors: Yamini Pandey, Fremont, CA (US); Helen Xiao Xu, Sunnyvale, CA (US); Joseph T. Kennedy, San Jose, CA (US)

(73) Assignee: Honeywell International Inc., Morris Plains, NJ (US)

( * ) Notice: Subject to any disclaimer, the term of this patent is extended or adjusted under 35 U.S.C. 154(b) by 87 days.

(21) Appl. No.: 15/691,096

(22) Filed: Aug. 30, 2017

(65) Prior Publication Data

US 2018/0208796 A1     Jul. 26, 2018

Related U.S. Application Data

(60) Provisional application No. 62/448,488, filed on Jan. 20, 2017.

(51) Int. Cl.
| | | |
|---|---|---|
| *C09D 183/04* | (2006.01) | |
| *C09D 7/20* | (2018.01) | |
| *H01L 23/29* | (2006.01) | |
| *H01L 23/31* | (2006.01) | |

(52) U.S. Cl.
CPC ........... *C09D 183/04* (2013.01); *C09D 7/20* (2018.01); *H01L 23/296* (2013.01); *H01L 23/3178* (2013.01)

(58) Field of Classification Search
None
See application file for complete search history.

(56) References Cited

U.S. PATENT DOCUMENTS

| | | |
|---|---|---|
| 5,472,488 A | 12/1995 | Allman |
| 6,420,441 B1 | 7/2002 | Allen et al. |
| 6,812,551 B2 | 11/2004 | Hawker et al. |
| 7,179,757 B2 | 2/2007 | Ramachandrarao et al. |
| 7,598,168 B2 | 10/2009 | Han et al. |
| 7,648,894 B2 | 1/2010 | Moon et al. |
| 8,101,015 B2 | 1/2012 | Kennedy et al. |
| 8,871,425 B2 | 10/2014 | Zhang et al. |
| 8,906,993 B2 | 12/2014 | Sekito et al. |
| 8,992,806 B2 | 3/2015 | Li et al. |
| 2003/0180999 A1 | 9/2003 | Endisch |
| 2004/0135254 A1 | 7/2004 | Fujita et al. |
| 2005/0064726 A1 | 3/2005 | Reid et al. |
| 2005/0089790 A1* | 4/2005 | Lee .................... G03F 7/0048 430/141 |
| 2006/0115658 A1 | 6/2006 | Mah et al. |
| 2006/0135633 A1 | 6/2006 | Lee et al. |
| 2009/0298671 A1 | 12/2009 | Weigel et al. |
| 2011/0171447 A1* | 7/2011 | Krishnamoorthy .. C09D 183/04 428/220 |
| 2013/0209754 A1* | 8/2013 | Zhang .................... C08L 83/04 428/195.1 |
| 2016/0244581 A1 | 8/2016 | Brink et al. |
| 2018/0088426 A1* | 3/2018 | Posset ..................... C09K 9/02 |

FOREIGN PATENT DOCUMENTS

| | | |
|---|---|---|
| JP | H07135212 A | 5/1995 |
| JP | H08143818 A | 6/1996 |
| JP | 200833016 A | 2/2008 |
| JP | 4564735 B2 | 10/2010 |
| JP | 4922292 B2 | 4/2012 |
| KR | 101390605 B1 | 4/2014 |
| KR | 1026211 B1 | 7/2017 |

OTHER PUBLICATIONS

Hogan, Zach L., et al. "Patterned Nanoporous Poly(Methylsilsesquioxane) Thin Films: A Potential High Density Substrate." Materials Science and Engineering, C 24:487-490, 2004.

Kim, B.R., et al. "Adhesion Properties of Polymethylsilsesquioxane Based Low Dielectric Constant Materials by the Modified Edge Lift-Off Test." Microelectronic Engineering, 85:74-80, 2008.

Kim, Hie-Joon, et al. "Observation of Low Molecular Weight Poly(methylsilsesquioxane)s by Graphite Plate Laser Desorption/Ionization Time-of-Flight Mass Spectrometry." Anal. Chem., 72:5673-5678, 2000.

Lee, Jin-Kyu, et al. "Synthetic Control of Molecular Weight and Microstructure of Processible Poly (Methylsilsesquioxane)s for Low-Dielectric Thin Film Applications." Polymer, 42:9085-9089, 2001.

International Search Report and Written Opinion issued in PCT/US2018/013745, dated May 3, 2018, 9 pages.

\* cited by examiner

*Primary Examiner* — Robert T Butcher
(74) *Attorney, Agent, or Firm* — Faegre Baker Daniels LLP

(57) ABSTRACT

A composition for planarizing a semiconductor device surface includes poly(methyl silsesquioxane) resin, at least one of a quaternary ammonium salt and an aminopropyltriethoxysilane salt, and at least one solvent. The poly(methyl silsesquioxane) resin ranges from 1 wt. % to 40 wt. % of the composition. The poly(methyl silsesquioxane) resin has a weight average molecular weight between 500 Da and 5,000 Da. The at least one of the quaternary ammonium salt and the aminopropyltriethoxysilane salt ranges from 0.01 wt. % to 0.20 wt. % of the composition. The at least one solvent comprises the balance of the composition.

16 Claims, 4 Drawing Sheets

GAP FILLING DIELECTRIC MATERIALS

CROSS-REFERENCE TO RELATED APPLICATION

This application claims priority to U.S. Provisional Patent Application Ser. No. 62/448,488 filed Jan. 20, 2017, the disclosure of which is hereby expressly incorporated by reference herein in its entirety.

FIELD

The present invention relates to dielectric materials, and in particular, to gap filling dielectric materials for semiconductor manufacturing.

BACKGROUND

In advanced semiconductor manufacturing, there is a need for dielectric materials which can be spin-coated onto a surface of a semiconductor device to fill narrow spaces or gaps between device structures to provide a relatively planar surface suitable for subsequent device layer processing.

Improvements in planarizing dielectric materials are desired to provide planarization for advanced semiconductor devices having gaps about 20 nanometers wide and narrower. It is important that such dielectric materials are void free and are able to substantially inhibit electrical current flow (leakage current) through the dielectric material.

SUMMARY

A composition for planarizing a semiconductor device surface includes poly(methyl silsesquioxane) resin, at least one of a quaternary ammonium salt and an aminopropyltriethoxysilane salt, and at least one solvent. The poly(methyl silsesquioxane) resin ranges from 1 wt. % to 40 wt. % of the composition. The poly(methyl silsesquioxane) resin has a weight average molecular weight between 500 Da and 5,000 Da. The at least one of the quaternary ammonium salt and the aminopropyltriethoxysilane salt ranges from 0.01 wt. % to 0.20 wt. % of the composition. The at least one solvent comprises the balance of the composition.

Various embodiments concern a composition for planarizing a semiconductor device surface. The composition includes poly(methyl silsesquioxane) resin, at least one of a quaternary ammonium salt and an aminopropyltriethoxysilane salt, and at least one solvent. The poly(methyl silsesquioxane) resin ranges from 1 wt. % to 40 wt. % of the composition. The poly(methyl silsesquioxane) resin has a weight average molecular weight between 500 Da and 5,000 Da. The at least one of the quaternary ammonium salt and the aminopropyltriethoxysilane salt ranges from 0.01 wt. % to 0.20 wt. % of the composition. The at least one solvent comprising the balance of the composition. In some embodiments, at least one of the quaternary ammonium salt and the aminopropyltriethoxysilane salt includes aminopropyltriethoxysilane triflate. In some embodiments, the at least one solvent is a solvent mixture including propylene glycol methyl ether acetate and n-butyl acetate with the ratio by weight of the propylene glycol methyl ether acetate to n-butyl acetate ranging from 0.5:1 to 2:1. In some particular embodiments, the composition further includes a high boiling point solvent ranging from 0.05 wt. % to 5 wt. % of the composition, the high boiling point solvent having a boiling point ranging from 154° C. to 274° C. In some further embodiments, the high boiling point solvent includes at least one of 1-octanol, benzyl alcohol, hexyl alcohol, ethylene glycol, dipropylene glycol, dipropylene glycol methyl ether, dipropylene glycol n-propyl ether, tripropylene glycol n-butyl ether, anisole, and propylene carbonate. In some embodiments, the composition further includes phenyl silsesquioxane ranging from 0.05 wt. % to 8 wt. % of the composition. In some embodiments, the composition further includes a surfactant ranging from 0.25 wt. % to 1 wt. % of the composition. In some particular embodiments, the surfactant includes a polyether-modified polydimethylsiloxane surfactant. In some embodiments, the poly(methyl silsesquioxane) has a weight average molecular weight between 1,200 Da and 4,300 Da.

Various embodiments concern a method for making a planarizing composition. The method includes providing poly(methyl silsesquioxane) resin having a weight average molecular weight between 500 Da and 5,000 Da, providing one or more solvents, dissolving the poly(methyl silsesquioxane) resin in the one or more solvents to form a poly(methyl silsesquioxane) solution, and dissolving at least one of a quaternary ammonium salt and an aminopropyltriethoxysilane salt in the poly(methyl silsesquioxane) solution to form the planarizing composition. In some embodiments, at least one of the quaternary ammonium salt and the aminopropyltriethoxysilane salt includes aminopropyltriethoxysilane triflate. In some embodiments, providing the one more solvents includes blending together propylene glycol methyl ether acetate and n-butyl acetate, the ratio by weight of the propylene glycol methyl ether acetate to n-butyl acetate ranging from 0.5:1 to 2:1. In some particular embodiments, providing the one or more solvents further includes blending a high boiling point solvent together with the propylene glycol methyl ether acetate and the n-butyl acetate, the high boiling point solvent having a boiling point ranging from 154° C. to 274° C. In some embodiments, the method further includes providing phenyl silsesquioxane, dissolving the phenyl silsesquioxane in a solvent to form a phenyl silsesquioxane solution, and blending the phenyl silsesquioxane solution with the poly(methyl silsesquioxane) solution to form the planarizing composition. In some embodiments, the method further includes dissolving a surfactant in the poly(methyl silsesquioxane) solution. In some embodiments, the method further includes filtering the planarizing composition through a series of at least two 0.1 micron filters.

Various embodiments include a planarizing film for a semiconductor device. The film includes cured poly(methyl silsesquioxane) formed of poly(methyl silsesquioxane) polymer chains having a weight average molecular weight between 500 Da and 5,000 Da. In some embodiments, the planarizing film further includes a residue of at least one of a quaternary ammonium salt and an aminopropyltriethoxysilane salt. In particular embodiments, the residue of the at least one of the quaternary ammonium salt and the aminopropyltriethoxysilane salt includes a residue of aminopropyltriethoxysilane triflate. In some embodiments, the planarizing film further includes a residue of phenyl silsesquioxane.

The above mentioned and other features of the invention, and the manner of attaining them, will become more apparent and the invention itself will be better understood by reference to the following description of embodiments of the invention taken in conjunction with the accompanying drawings.

DETAILED DESCRIPTION

Embodiments of the disclosure can employ a poly(methyl silsesquioxane) resin in a composition for spin-coating onto a surface of a semiconductor device to planarize the semiconductor device surface. A planarizing film formed by curing the poly(methyl silsesquioxane) composition according to embodiments of this disclosure has been found to exhibit excellent dielectric properties and a low leakage current level. The planarizing film has also been found to be thermally stable up to 450° C. in nitrogen and to be dimensionally stable.

Figure 1:
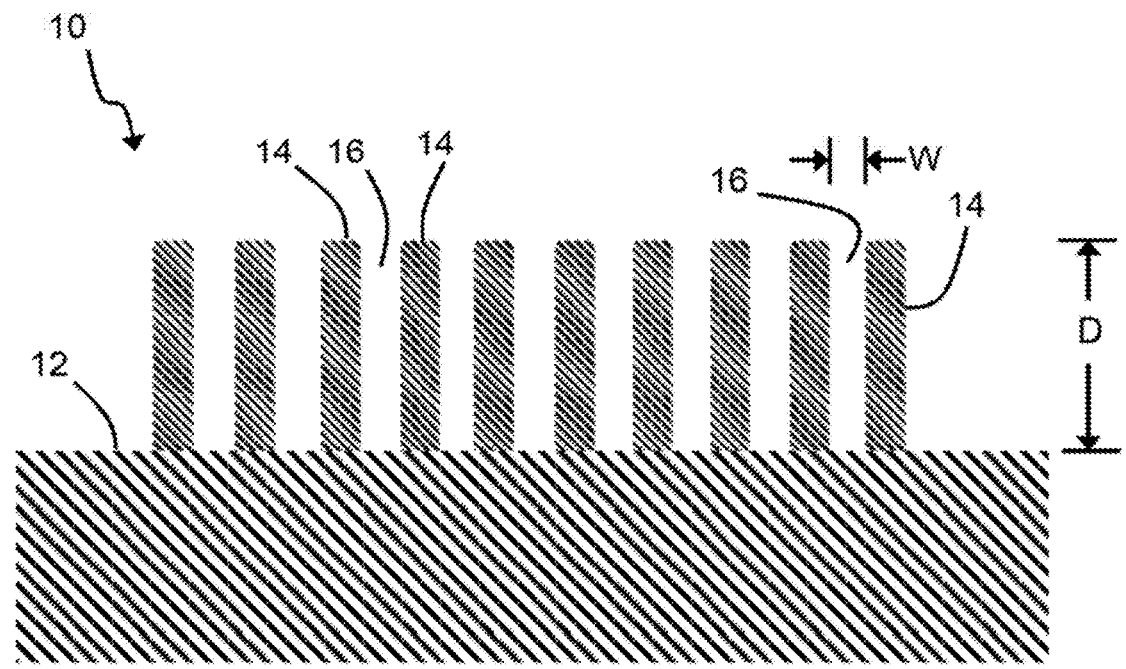
FIG. 1 is a schematic cross-section of a portion of a semiconductor device illustrating surface topography to be planarized.

FIG. 1 is a schematic cross-section of a portion of a semiconductor device illustrating surface topography to be planarized. FIG. 1 shows a device 10 including a substrate 12 and a plurality of fins 14. The substrate 12 may be, for example, a layer of an insulating material, such as silicon dioxide or silicon nitride. The substrate 12 may be on top of other device layers (not shown). The plurality of fins 14 may be, for example, fins of a conductive material, such as doped silicon, copper, or aluminum. The plurality of fins 14 form a plurality of gaps 16, each gap 16 defined by an adjacent pair of fins 14, as shown in FIG. 1. As further shown in FIG. 1, each gap 16 may be described as having a width W and a depth D. Thus, each gap 16 may be further defined by an aspect ratio. For the purposes of this disclosure, the aspect ratio of each gap 16 as a ratio of its depth D to its width W, often expressed as D:W. Gaps with higher aspect ratios, such as 4:1, 6:1, 8:1, or 10:1 or higher can be challenging to fill completely, or substantially completely, with a planarizing film.

Figure 2:
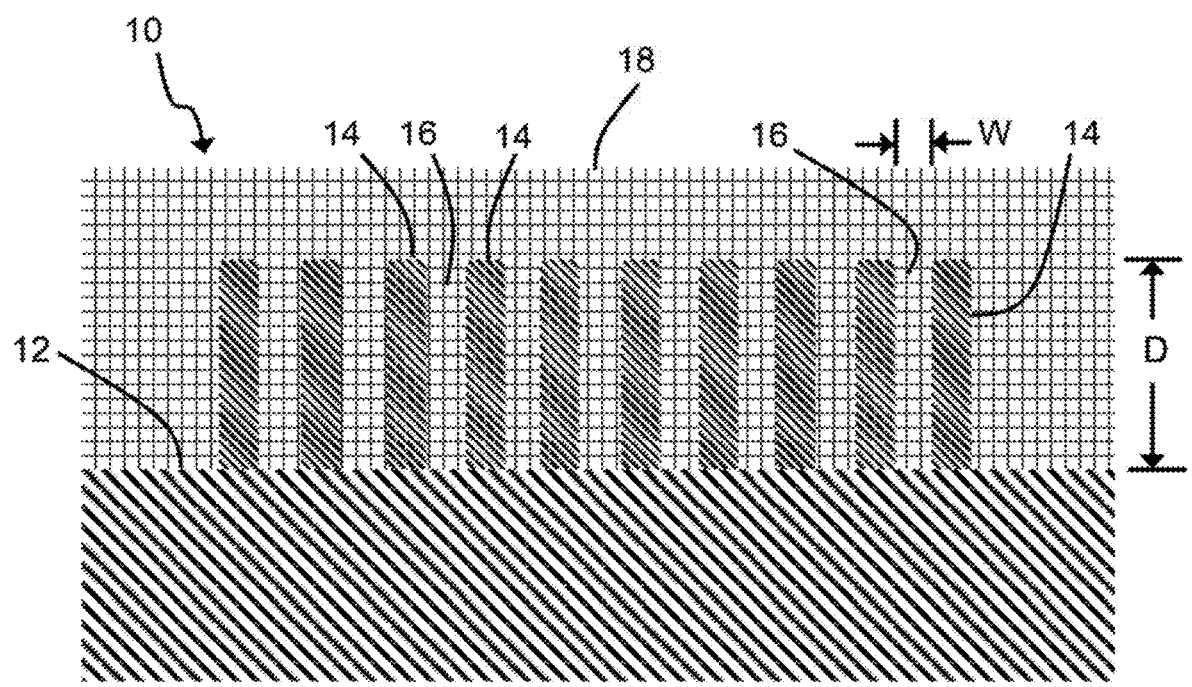
FIG. 2 is a schematic cross-section of the portion of the semiconductor device of FIG. 1 illustrating planarization of the surface topography by a planarization film according to embodiments of this disclosure.

FIG. 2 is a schematic cross-section of the portion of the semiconductor device 10 of FIG. 1 illustrating planarization of the surface topography by a planarization film according to embodiments of this disclosure. FIG. 2 shows the device 10 after formation of a planarizing film 18 from a poly(methyl silsesquioxane) composition according to embodiments of this disclosure. The planarizing film 18 fills each of the plurality of gaps 16 to provide excellent dielectric characteristics and to minimize leakage currents between adjacent fins 14. The planarizing film also provides a substantially planar surface upon which subsequent devices layers (not shown) may be formed.

FIGS. 1 and 2 illustrate one example in which the planarization films according to embodiments of the disclosure may be employed. It is understood that the planarizing films according to embodiments of the disclosure may be employed on many other topographies involving different arrangements of conductive, non-conductive, and semiconductive materials.

It has been found that by limiting the weight average molecular weight (Mw) of the poly(methyl silsesquioxane) resin in the composition to no greater than 5,000 Daltons (Da), the composition can provide planarization for advanced semiconductor devices having topography including gaps about 20 nanometers wide and narrower, the gaps having aspect ratios of at least 4:1. In contrast, compositions including poly(methyl silsesquioxane) resins having Mw greater than 10,000 Da were found to be unable fill 20 nanometer wide gaps at aspect ratios of at least 4:1 without significant defects, including voids in the subsequently cured film. Without wishing to be bound by any theory, it is believed that the lower viscosity provided by the lower molecular weight poly(methyl silsesquioxane) enables filling of gaps 20 nanometers wide and at high aspect ratios.

In some embodiments, weight average molecular weight (Mw) of the poly(methyl silsesquioxane) resin in the composition is as low as 500 Da, 600 Da, 700 Da, 800 Da, 1,000 Da, or 1,200 Da or as high as 1,600 Da, 2,100 Da, 2,600 Da, 3,400 Da, 4,300 Da, or 5,000 Da, or within any range defined by any two of the preceding values. For example, in some embodiments, the Mw of the poly(methyl silsesquioxane) resin in the composition ranges from 500 Da to 5,000 Da, 600 Da to 4,300 Da, 1,000 Da to 2,100 Da, 1,200 DA to 4,300 Da, or 1,200 Da to 1,600 Da. In some embodiments, the Mw of the poly(methyl silsesquioxane) resin in the composition is about 1,300 Da. The Mw can be measured by gel permeation chromatography, as is known in the art.

In some embodiments, at least 90% of the silicon in the poly(methyl silsesquioxane) resin in the composition is present in poly(methyl silsesquioxane) polymer chains having a weight average molecular weight less than or equal to 5,000 Da, and less than 10% of the silicon in the poly(methyl silsesquioxane) resin in the composition is present in poly(methyl silsesquioxane) polymer chains having a weight average molecular weight greater than 5,000 Da. In some embodiments, at least 92%, 94%, 96%, 98%, or 99% (or any value between any of the preceding values) of the silicon in the poly(methyl silsesquioxane) resin in the composition is present in poly(methyl silsesquioxane) polymer chains having a weight average molecular weight less than or equal to 5,000 Da, and no more than 8%, 6%, 4%, 2% or 1% (or any value between any of the preceding values) of the silicon present in the poly(methyl silsesquioxane) resin in the composition is present in poly(methyl silsesquioxane) polymer chains having a weight average molecular weight greater than 5,000 Da.

The composition can include poly(methyl silsesquioxane) resin having a weight average molecular between 500 Da and 5,000 Da and at least one solvent to bring the poly(methyl silsesquioxane) into solution. In some embodiments, the at least one solvent can include single solvent, such as a glycol ether, a glycol ether acetate, n-butyl acetate, a ketone, or an alcohol. Glycol ethers can include, for example, propylene glycol propyl ether or propylene glycol methyl ether. Glycol ether acetates can include, for example, propylene glycol methyl ether acetate (PGMEA), 2-ethoxyethyl acetate, or 2-methoxyethyl acetate. Ketones can include, for example, acetone or diethyl ketone. Alcohols can include, for example, isopropyl alcohol, butanol, or ethanol. In other embodiments, the at least one solvent includes a mixture two or more of the foregoing solvents. For example, in some embodiments, the at least one solvent can include a mixture of a solvent having a relatively moderate boiling point, such as PGMEA, and another solvent having a relatively low boiling point, such as n-butyl acetate. It has been found that by blending PGMEA with n-butyl acetate, the resulting planarizing film exhibits fewer striations and wind ripple defects when compared with embodiments including only PGMEA as a solvent.

In some embodiments, the ratio by weight of the PGMEA to the n-butyl acetate can be as low as 0.5:1, 0.6:1, 0.7:1, 0.8:1 or 0.9:1, or as high as 1.1:1, 1.2:1, 1.4:1, 1.6:1, 1.8:1, or 2:1, or within any range defined by any two of the preceding values. For example, in some embodiments, the ratio by weight of the PGMEA to the n-butyl acetate ranges from 0.5:1 to 2:1, 0.6:1 to 1.8:1, 0.7:1 to 1.6:1, 0.8:1 to 1.4:1 or 0.9:1 to 1.2:1. In some embodiments, the ratio by weight of the PGMEA to the n-butyl acetate is about 1:1. In some embodiments, the at least one solvent consists of PGMEA and n-butyl acetate in any of the preceding ratios.

In some embodiments, the concentration of the poly (methyl silsesquioxane) resin in the composition can be as low as 1 weight percent (wt. %), 5 wt. %, 10 wt. %, or 15 wt. %, or as high as 25 wt. %, 30 wt. %, 35 wt. %, or 40 wt. % of the total weight of the composition, or within any range defined by any two of the preceding values, the balance of the composition being the at least one solvent. In some embodiments, the concentration of the poly(methyl silsesquioxane) resin in the composition can range from 1 wt. % to 40 wt. %, 5 wt. % to 35 wt. %, 10 wt. % to 30 wt. %, or 15 wt. % to 25 wt. % of the total weight of the composition, the balance of the composition being the at least one solvent.

In some embodiments, the composition can further include a quaternary ammonium salt and/or an aminopropyltriethoxysilane salt. It has been found that adding quaternary ammonium salt, such as tetramethyl ammonium nitrate, tetrabutyl ammonium acetate, tetramethyl ammonium acetate, tetrabutyl ammonium nitrate, and/or an aminopropyltriethoxysilane salt, such as aminopropyltriethoxysilane triflate, can reduce outgassing of the composition which may occur as the composition is heated after being coated onto the surface of a semiconductor device. Such outgassing can adversely affect various semiconductor processes, reduce long-term device reliability, and shorten the useful life of equipment used to make semiconductor devices.

In some embodiments, the concentration of the quaternary ammonium salt and/or the aminopropyltriethoxysilane salt in the composition can be as low as 0.01 wt. %, 0.02 wt. %, 0.04 wt. %, 0.06 wt. %, or 0.08 wt. %, or as high as 0.12 wt. %, 0.14 wt. %, 0.16 wt. %, 0.18 wt. %, or 0.20 wt. % of the total weight of the composition, or within any range defined by any two of the preceding values. In some embodiments, the concentration of the quaternary ammonium salt and/or the aminopropyltriethoxysilane salt in the composition can range from 0.01 wt. % to 0.20 wt. %, 0.02 wt. % to 0.18 wt. %, 0.04 wt. % to 0.16 wt. %, 0.06 wt. % to 0.14 wt. %, or 0.08 wt. % to 0.12 wt. % of the total weight of the composition. In some embodiments, the concentration of the quaternary ammonium salt and/or the aminopropyltriethoxysilane salt in the composition can be about 0.1 wt. %.

In some embodiments, the composition can further include a high boiling point solvent. Is has been found that the addition of a high boiling point solvent can further improve gap filling and planarization characteristics of the planarizing film. Without wishing to be bound by any theory, it is believed that high boiling point solvents with high vapor pressures will tend to stay in the composition longer during spin-coating and subsequent baking processes. It is believed that the high boiling point solvent improves the fluid properties of the composition, improving the ability of the composition to level and to fill gaps between high aspect ratio features. In some embodiments, the boiling point of the high boiling point solvent can be as low as 154° C., 170° C., 180° C., or 190° C., or as high as 213° C., 230° C., 245° C., or 274° C., or between any two of the preceding values. In some embodiments, the boiling point of the high boiling point solvent can range from 154° C. to 274° C., 170° C. to 245° C., 180° C. to 230° C., or 190° C. to 213° C. Examples of high boiling point solvents include 1-octanol, benzyl alcohol, hexyl alcohol, ethylene glycol, dipropylene glycol, dipropylene glycol methyl ether, dipropylene glycol n-propyl ether, tripropylene glycol n-butyl ether, anisole, and propylene carbonate.

In some embodiments, the concentration of the high boiling point solvent in the composition can be as low as 0.05 wt. %, 0.07 wt. %, 0.1 wt. %, or 0.2 wt. %, or as high as 0.7 wt. %, 1 wt. %, 2 wt. %, or 5 wt. % of the of the total weight of the composition, or within any range defined by any two of the preceding values. In some embodiments, the concentration of the high boiling point solvent in the composition can range from 0.05 wt. % to 5 wt. %, 0.07 wt. % to 2 wt. %, 0.1 wt. % to 1 wt. %, or 0.2 wt. % to 0.7 wt. % of the total weight of the composition. In some embodiments, the concentration of the high boiling point solvent in the composition can be about 0.5 wt. % of the total weight of the composition.

In some embodiments, the composition can further include phenyl silsesquioxane. The phenyl silsesquioxane can act as a plasticizer, further improving the fluid properties of the composition. In some embodiments, the concentration of the phenyl silsesquioxane in the composition can be as low as 0.05 wt. %, 0.1 wt. %, 0.2 wt. %, or 0.3 wt. % or as high as 1 wt. %, 2 wt. %, 4 wt. %, or 8 wt. % of the of the total weight of the composition, or within any range defined by any two of the preceding values. In some embodiments, the concentration of the phenyl silsesquioxane in the composition can range from 0.05 wt. % to 8 wt. %, 0.1 wt. % to 4 wt. %, 0.2 wt. % to 2 wt. %, or 0.3 wt. % to 1 wt. % of the total weight of the composition. In some embodiments, the concentration of the phenyl silsesquioxane in the composition can be about 0.5 wt. % of the total weight of the composition.

In some embodiments, the composition can further include a surfactant. It has been found that a surfactant can further reduce striations and wind ripple defects, which may be particularly useful when the composition is spin-coated onto larger diameter semiconductor device wafers, such as 300 mm diameter wafers. In some embodiments, the surfactant can be a polyether-modified polydimethylsiloxane surfactant, such a BYK®-306 or BYK®-307 available from BYK-Chemie, Wesel, Germany.

In some embodiments, the concentration of the surfactant in the composition can be as low as 0.25 wt. %, 0.3 wt. %, 0.4 wt. %, or 0.5 wt. %, or as high as 0.7 wt. %, 0.8 wt. %, 0.9 wt. %, or 1 wt. % of the total weight of the composition, or within any range defined by any two of the preceding values. In some embodiments, the concentration of the surfactant in the composition can range from 0.25 wt. % to 1 wt. %, 0.30 wt. % to 0.90 wt. %, 0.40 wt. % to 0.80 wt. %, or 0.50 wt. % to 0.70 wt. % of the total weight of the composition.

A method for making a planarizing composition in accordance with embodiments of this disclosure can include providing poly(methyl silsesquioxane) resin having a weight average molecular weight between 500 Da and 5,000 Da and providing one or more solvents according to any of the embodiments described above. The poly(methyl silsesquioxane) resin can be dissolved in the one or more solvents to form a poly(methyl silsesquioxane) solution. A quaternary ammonium salt and/or an aminopropyltriethoxysilane salt according to any of the embodiments described above can be dissolved in the poly(methyl silsesquioxane) solution to form the planarizing composition.

In some embodiments, providing the one or more solvents can include blending together PGMEA and n-butyl acetate in a ratio according to any of the embodiments described above. In some embodiments, providing the one or more solvents can further include blending in a high boiling point solvent according to any of the embodiments described above.

In some embodiments, the method for making the planarizing composition can further include providing phenyl silsesquioxane according to any of the embodiments described above. The phenyl silsesquioxane can be dissolved in one or more solvents to form a phenyl silsesquioxane solution. The one or more solvents can be the same or different than the one or more solvents provided to dissolve the poly(methyl silsesquioxane). For example, the poly (methyl silsesquioxane) can be dissolved in a 1:1 mixture of PGMEA and n-butyl acetate and the phenyl silsesquioxane can be dissolved in PGMEA. The phenyl silsesquioxane solution can be blended with the poly(methyl silsesquioxane) solution to form the planarizing composition.

In some embodiments, the method for making the planarizing composition can further include providing a surfactant according to any of the embodiments described above and dissolving the surfactant in the poly(methyl silsesquioxane) solution to form the planarizing composition.

In some embodiments, the planarizing composition can be mixed overnight on a roller mixer for a homogeneous solution. In some embodiments, the planarizing composition can be filtered through a series of at least two 0.1 micron filters.

In use, planarizing compositions according to embodiments of this disclosure can be spin-coated onto a surface of a semiconductor device wafer, planarizing the topography of the surface. The semiconductor device wafer can then be baked at temperatures ranging from 120° C. to 280° C. for times ranging from 1 minute to 5 minutes to drive off substantially all of the one or more solvents from the planarizing composition. The semiconductor device wafer can then be cured at temperatures ranging from about 400° C. to about 450° C. to form a planarizing film. The planarizing film can be a permanent part of the semiconductor device.

A planarizing film according to embodiments of this disclosure can include cured poly(methyl silsesquioxane) formed of poly(methyl silsesquioxane) polymer chains having a weight average molecular weight between 500 Da and 5,000 Da. In some embodiments, the planarizing film can further include a residue of a quaternary ammonium salt and/or an aminopropyltriethoxysilane salt according to any of the embodiments described above, such as aminopropyltriethoxysilane triflate. In some embodiments, the planarizing film can further include a residue of phenyl silsesquioxane, according to any of the embodiments describe above. In some embodiments, the planarizing film can further include a surfactant residue, according to any of the embodiments described above, including a polyether-modified polydimethylsiloxane surfactant, such a BYK®-307.

While this invention has been described as relative to exemplary designs, the present invention may be further modified within the spirit and scope of this disclosure. Further, this application is intended to cover such departures from the present disclosure as come within known or customary practice in the art to which this invention pertains.

EXAMPLES

Comparative Example 1

High Molecular Weight Poly(Methyl Silsesquioxane)

Poly(methyl silsesquioxane) resin GR 650 was obtained from Techneglas, Perrysburg, Ohio. The weight average molecular weight (Mw) of the poly(methyl silsesquioxane was found by preparing a solution of 45 wt. % poly(methyl silsesquioxane in a 50/50 mix of PGMEA and n-butyl acetate and then filtering the solution with a 0.1 micron filter. The filtered solution was then analyzed by gel permeation chromatography (GPC), as is known in the art to determine the Mw. The Mw of the poly(methyl silsesquioxane) was found to be 10,223 Da.

Figure 3:
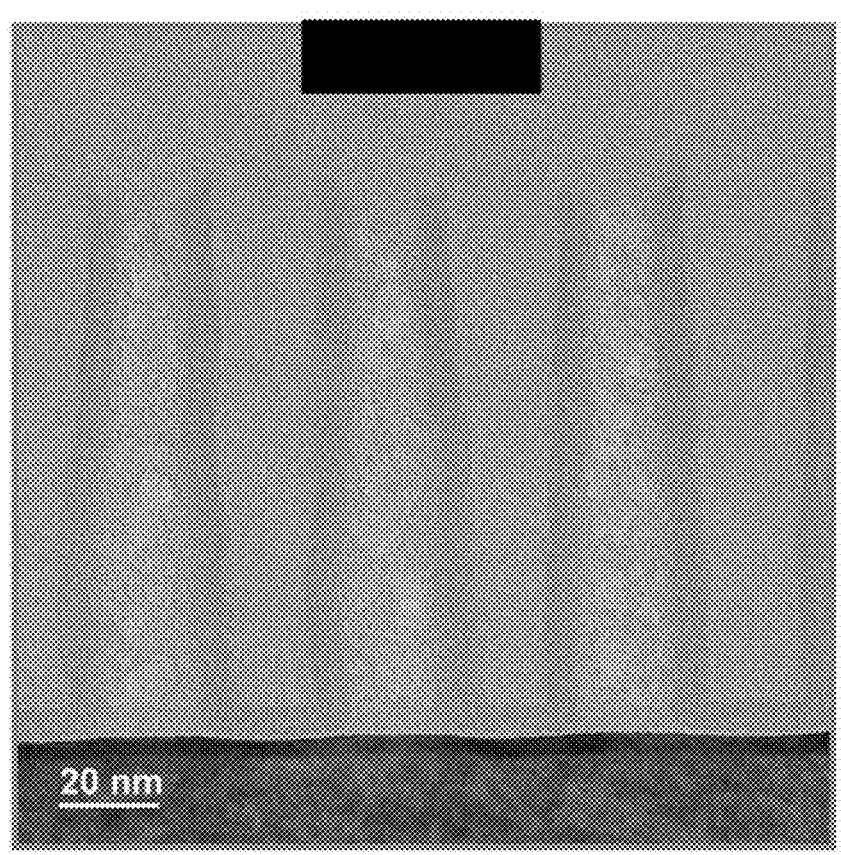
FIG. 3 is a TEM micrograph of a planarizing film formed from a high molecular weight poly(methyl silsesquioxane) resin

100 grams (g) of the 10,223 Da poly(methyl silsesquioxane) resin was added to 400 g of propylene glycol monomethyl ether acetate (PGMEA). The combination was mixed overnight on a roller mixer to ensure homogeneity. The resulting solution was filtered through a series of two, 0.1 micron filters. The solution was spin-coated onto a 200 mm diameter patterned test wafer including high aspect ratio features about 20 nm in width and about 80 nm to 100 nm deep. The wafer with the cast film was baked on a series of three hot plates for 60 seconds each, the hot plates having temperatures of 140° C., 150° C., and 210° C., respectively. The wafer with the baked film was cured on a hot plate at 425° C. for 5 minutes in a nitrogen ambient and immediately cooled on a cooling plate. The patterned wafer was evaluated for gap fill by a tunneling electron microscope (TEM) analysis. FIG. 3 shows a TEM micrograph of the planarizing film formed from the 10,223 Da poly(methyl silsesquioxane) resin. As shown in FIG. 3, many voids were observed in the high aspect ratio features. Severe outgassing during the hot plate baking was observed.

Example 2

Low Molecular Weight Poly(Methyl Silsesquioxane)

Poly(methyl silsesquioxane) resin GR 650 having a molecular weight of about 1.5K Da was obtained from Techneglas, Perrysburg, Ohio. The actual weight average molecular weight (Mw) of the poly(methyl silsesquioxane was found by preparing a solution of 45 wt. % poly(methyl silsesquioxane in a 50/50 mix of PGMEA and n-butyl acetate and then filtering the solution with a 0.1 micron filter. The filtered solution was then analyzed by gel permeation chromatography (GPC), as is known in the art to determine the Mw. The Mw of the poly(methyl silsesquioxane) was found to be 1,323 Da.

100 g of the 1,323 Da poly(methyl silsesquioxane) resin was added to 400 g of propylene glycol monomethyl ether acetate (PGMEA). The combination was mixed overnight on a roller mixer to ensure homogeneity. The resulting solution was filtered through a series of two, 0.1 micron filters. The solution was spin-coated onto a 200 mm diameter blank silicon wafer. The wafer with the cast film was baked on a series of three hot plates for 60 seconds each, the hot plates having temperatures of 140° C., 150° C., and 210° C., respectively. The wafer with the baked film was cured on a hot plate at 425° C. for 5 minutes in a nitrogen ambient and immediately cooled on a cooling plate. The 200 mm coated wafer was evaluated for film defects under an optical microscope at 50× magnification. Striations and wind ripple defects were observed. Severe outgassing during the hot plate baking was also observed.

Example 3

Low Molecular Weight Poly(Methyl Silsesquioxane) and Solvent Blend 210 g of PGMEA and 210 g of n-butyl acetate were blended together to form a solvent mixture. 100 g of the 1,323 poly(methyl silsesquioxane) resin was combined with the 420 g of the solvent mixture. The combination was mixed overnight on a roller mixer to ensure homogeneity. This solution was filtered through a series of two, 0.1 micron filters.

The solution was spin-coated onto a 200 mm diameter blank silicon wafer. The wafer with the cast film was baked on a series of three hot plates for 60 seconds each, the hot plates having temperatures of 140° C., 150° C., and 210° C., respectively. The wafer with the baked film was cured on a hot plate at 425° C. for 5 minutes in a nitrogen ambient and immediately cooled on a cooling plate. The wafer was observed under an optical microscope at 50× magnification. No striations or wind ripple defects were observed. Severe outgassing during the hot plate baking was observed.

Example 4

Low Molecular Weight Poly(Methyl Silsesquioxane), Solvent Blend, Aminopropyltriethoxysilane Salt 210 g of PGMEA and 210 g of n-butyl acetate were blended together to form a solvent mixture. 100 g of the 1,323 Da poly(methyl silsesquioxane) resin was combined with the 420 g of the solvent mixture. The combination was mixed overnight on a roller mixer to ensure homogeneity. The resulting solution was filtered through a series of two, 0.1 micron filters. 0.33 g of aminopropyltriethoxysilane triflate was added to the solution of the poly(methyl silsesquioxane) and mixed for 1 hour on the roller mixer to ensure homogeneity and then filtered through a series of two, 0.1 micron filters.

Figure 4:
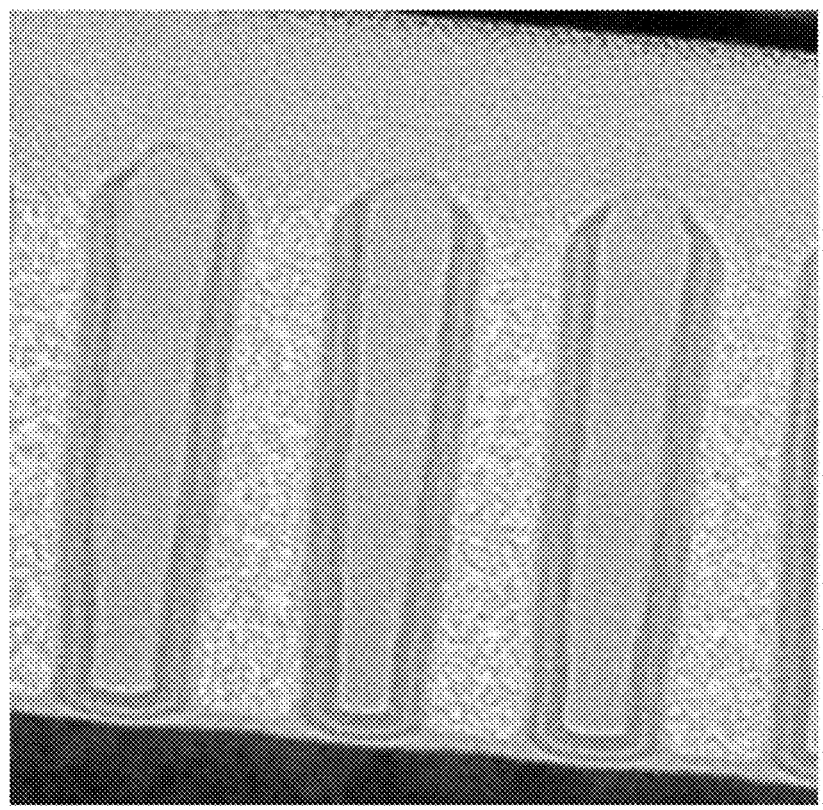
FIG. 4 is a TEM micrograph of a planarizing film formed according to embodiments of this disclosure.

The solution was spin-coated onto a 200 mm diameter blank silicon wafer and a 200 mm diameter patterned test wafer including high aspect ratio features about 20 nm in width and about 80 nm to 100 nm deep. The wafers with the cast film were baked on a series of three hot plates for 60 seconds each, the hot plates having temperatures of 140° C., 150° C., and 210° C., respectively. The wafers with the baked film were cured on a hot plate at 425° C. for 5 minutes in a nitrogen ambient and immediately cooled on a cooling plate. The coated blank silicon wafer was observed under an optical microscope at 50× magnification. No striations or wind ripple defects were observed. No outgassing was observed on the coated blank silicon wafer at any of the hot plate bakes. The patterned test wafer was evaluated for gap fill by a tunneling electron microscope (TEM) analysis. FIG. 4 shows a TEM micrograph of the planarizing film formed from the 1,323 Da poly(methyl silsesquioxane) resin. As shown in FIG. 4, planarization and gap-filling are good with no voids observed in the high aspect ratio features.

Example 5

Low Molecular Weight Poly(Methyl Silsesquioxane), Solvent Blend, Phenyl Silsesquioxane 410 g of PGMEA and 410 g of n-butyl acetate was blended together to form a solvent mixture. 100 g of the 1,323 Da poly(methyl silsesquioxane) resin was combined with the 420 g of the solvent mixture. The combination was mixed overnight on a roller mixer to ensure homogeneity. The resulting solution was filtered through a series of two, 0.1 micron filters. 23 g of phenyl silsesquioxane was combined with 77 g of PGMEA to form a phenyl silsesquioxane solution. The phenyl silsesquioxane solution was mixed overnight on the roller mixer to ensure homogeneity and then filtered through a series of two, 0.1 micron filters. 0.33 g of aminopropyltriethoxysilane triflate was added to the solution of the poly(methyl silsesquioxane) and mixed for 1 hour on the roller mixer to ensure homogeneity and then filtered through a series of two, 0.1 micron filters.

The poly(methyl silsesquioxane) solution was combined with the phenyl silsesquioxane solution in three proportions to create three separate batches for evaluation. In the first batch, 90 g of the poly(methyl silsesquioxane) solution was combined with 10 g of the phenyl silsesquioxane solution. In the second batch, 80 g of the poly(methyl silsesquioxane) solution was combined with 20 g of the phenyl silsesquioxane solution. In the third batch, 70 g of the poly(methyl silsesquioxane) solution was combined with 30 g of the phenyl silsesquioxane solution.

Each of the solutions was spin-coated onto three different 200 mm diameter blank silicon wafers. The wafers with the cast film were baked on a series of three hot plates for 60 seconds each, the hot plates having temperatures of 140° C., 150° C., and 210° C., respectively. The wafers with the baked film were cured on a hot plate at 425° C. for 5 minutes in a nitrogen ambient and immediately cooled on a cooling plate. The wafers were inspected and planarizing film found to be hazy.

Example 6

Low Molecular Weight Poly(Methyl Silsesquioxane), Solvent Blend, Surfactant 210 g of PGMEA and 210 g of n-butyl acetate was blended together to form a solvent mixture. 100 g of the 1,323 Da poly(methyl silsesquioxane) resin was combined with the 420 g of the solvent mixture. The combination was mixed overnight on a roller mixer to ensure homogeneity. The resulting solution was filtered through a series of two, 0.1 micron filters.

A surfactant, BYK®-307, was added in three weight percentages to the solution of the poly(methylene silsesquioxane). In the first batch, 1.5 g of surfactant was added to 150 g of the solution of the poly(methyl silsesquioxane) such that the surfactant was 1 wt. % of the solution. In the second batch, 0.75 g of surfactant was added to 150 g of the solution of the poly(methyl silsesquioxane) such that the surfactant was 0.5 wt. % of the solution. In the third batch, 0.375 g of surfactant was added to 150 g of the solution of the poly(methyl silsesquioxane) such that the surfactant was 0.25 wt. % of the solution. The resulting solutions were each mixed for 1 hour on the roller mixer to ensure homogeneity and then filtered through a series of two, 0.1 micron filters.

Each of the solutions was spin-coated onto different 300 mm diameter blank silicon wafers. The wafers with the cast films were baked on a series of three hot plates for 60 seconds each, the hot plates having temperatures of 140° C., 150° C., and 210° C., respectively. The wafers with the baked films were cured on a hot plate at 425° C. for 5 minutes in a nitrogen ambient and immediately cooled on a cooling plate. The coated wafers were observed under an optical microscope at 50× magnification. Striations and wind ripple defects were observed in the wafer coated with the 1 wt. % surfactant solution. No striations or wind ripple defects were observed in the wafers coated with the 0.5 wt. % solution or the 0.25 wt. % solution.

Example 7

Low Molecular Weight Poly(Methyl Silsesquioxane), High Boiling Point Solvent 420 g of PGMEA and 420 g of n-butyl acetate was blended together to form a solvent mixture. 200 g of the 1,323 Da poly(methyl silsesquioxane) resin was combined with 840 g of the solvent mixture. The combination was mixed for 1 hour on a roller mixer to form a solution. Eight, 100 g portions of the solution were prepared. 0.5 g of each of eight high boiling point solvents was added to a different one of the eight, 100 g portions along with 0.06 g of aminopropyltriethoxysilane triflate to form solutions containing 0.5 wt. % of a high boiling point solvent. The resulting portions were each mixed for 30 minutes on the roller mixer and then filtered through a series of two, 0.1 micron filters. The eight high boiling point solvents used were: 1-octanol, benzyl alcohol, hexyl alcohol, ethylene glycol, dipropylene glycol methyl ether, dipropylene glycol n-propyl ether, tripropylene glycol n-butyl ether, and anisole.

This process was repeated twice, increasing the amount of high boiling point solvent added (1 g and 5 g) to produce a second set of eight, 100 g portions forming solutions containing 1 wt. % of a high boiling point solvent, and a third set of eight, 100 g portions forming solutions containing 5 wt. % of a high boiling point solvent.

Each of the 24 portions was spin-coated onto a different 100 mm diameter blank silicon wafer. The 24 wafers with the cast films were baked on a series of three hot plates for 60 seconds each, the hot plates having temperatures of 140° C., 150° C., and 210° C., respectively. The wafers with the baked films were cured on a hot plate at 425° C. for 5 minutes in a nitrogen ambient and immediately cooled on a cooling plate. The coated wafers were observed under an optical microscope at 50× magnification. The results are shown in Table 1. As shown in Table 1, all of the wafers coated with solutions containing 0.5 wt. % of a high boiling point solvent were found to be free of any defects. Most of the wafers coated with solutions containing 1 wt. % of a high boiling point solvent were found to be free of any defects. Some of the wafers coated with solutions containing 5 wt. % of a high boiling point solvent were found to be free of any defects.

TABLE 1

| Solvent | Boiling Point (° C.) | Film Quality for 0.5 wt. % | Film Quality for 1 wt. % | Film Quality for 5 wt. % |
|---|---|---|---|---|
| 1-Octanol | 195 | No defects | No defects | Few defects |
| Benzyl alcohol | 205 | No defects | No defects | Few defects |
| Hexyl alcohol | 157 | No defects | Few defects | Few defects |
| Ethylene Glycol | 197 | No defects | No defects | No defects |
| Dipropylene glycol methyl ether | 190 | No defects | No defects | Few defects |
| Dipropylene glycol n-propyl ether | 213 | No defects | No defects | No defects |
| Tripropylene glycol n-butyl ether | 274 | No defects | Few defects | Many defects |
| Anisole | 154 | No defects | Few defects | Many defects |

Example 8

Low Molecular Weight Poly(Methyl Silsesquioxane), Solvent Blend, Aminopropyltriethoxysilane Salt Poly(methyl silsesquioxane) resin GR 650 having a molecular weight of about 5K Da was obtained from Techneglas, Perrysburg, Ohio. The actual weight average molecular weight (Mw) of the poly(methyl silsesquioxane) was found by preparing a solution of 45 wt. % poly(methyl silsesquioxane) in a 50/50 mix of PGMEA and n-butyl acetate and then filtering the solution with a 0.1 micron filter. The filtered solution was then analyzed by gel permeation chromatography (GPC), as is known in the art to determine the Mw. The Mw of the poly(methyl silsesquioxane) was found to be 4,114 Da.

26 g of PGMEA and 26 g of n-butyl acetate were blended together to form a solvent mixture. 10 g of the 4,114 Da poly(methyl silsesquioxane) resin was combined with the 52 g of the solvent mixture and 0.1 g of aminopropyltriethoxysilane triflate. The combination was mixed for 30 minutes on a roller mixer to ensure homogeneity. The resulting solution was filtered through a series of two, 0.1 micron filters.

Figure 5:
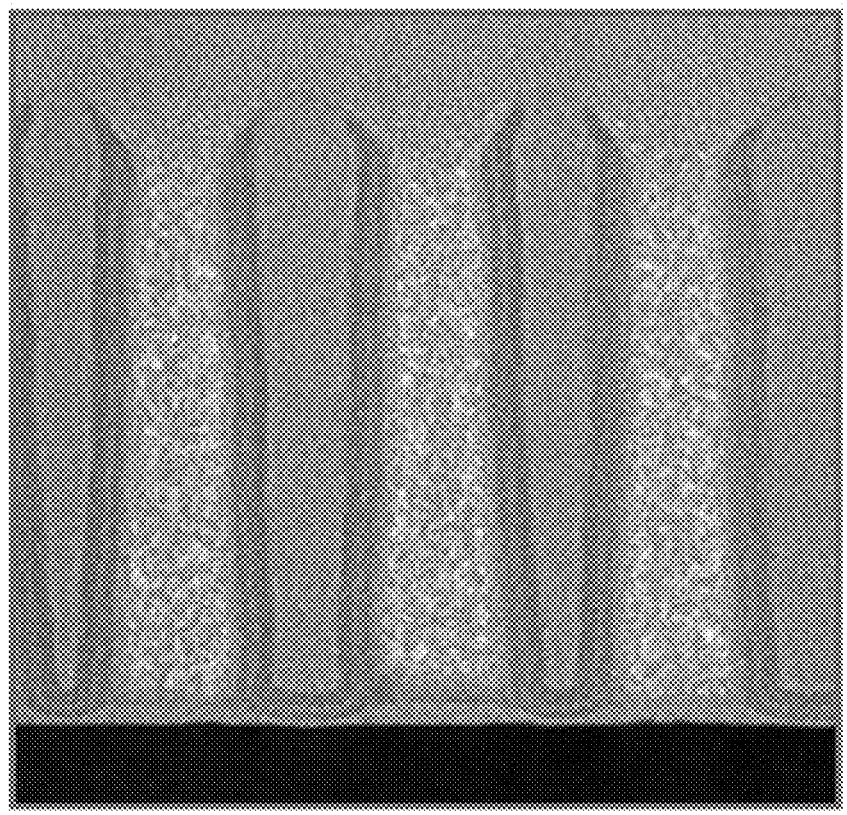
FIG. 5 is a TEM micrograph of another planarizing film formed according to embodiments of this disclosure.

The solution was spin-coated onto a 200 mm diameter blank silicon wafer and a 200 mm diameter patterned test wafer including high aspect ratio features about 20 nm in width and about 80 nm to 100 nm deep. The wafers with the cast film were baked on a series of three hot plates for 60 seconds each, the hot plates having temperatures of 140° C., 150° C., and 210° C., respectively. The wafers with the baked film were cured on a hot plate at 425° C. for 5 minutes in a nitrogen ambient and immediately cooled on a cooling plate. The coated blank silicon wafer was observed under an optical microscope at 50× magnification. No striations or wind ripple defects were observed. No outgassing was observed on the coated blank silicon wafer at any of the hot plate bakes. The patterned test wafer was evaluated for gap fill by a tunneling electron microscope (TEM) analysis. FIG. 5 shows a TEM micrograph of the planarizing film formed from the 4,114 Da poly(methyl silsesquioxane) resin. As shown in FIG. 5, planarization and gap-filling are good with no voids observed in the high aspect ratio features.

Example 9

Low Molecular Weight Poly(Methyl Silsesquioxane)

250 g of PGMEA and 250 g of n-butyl acetate were blended together to form a solvent mixture. 100 g of the 1,323 Da poly(methyl silsesquioxane) resin was added to the 500 g of solvent mixture. 0.15 g of 2% tetramethyl ammonium nitrate in DI water was combined with the solution of poly(methyl silsesquioxane) and the combination was mixed overnight on a roller mixer to ensure homogeneity. The resulting solution was filtered through a series of two, 0.1 micron filters.

The solution was spin-coated onto a 200 mm diameter blank silicon wafer. The wafer with the cast film was baked on a series of three hot plates for 60 seconds each, the hot plates having temperatures of 100° C., 140° C., and 210° C., respectively. The wafer with the baked film was cured on a hot plate at 425° C. for 5 minutes in a nitrogen ambient and immediately cooled on a cooling plate. The 200 mm coated wafer was evaluated for film defects under an optical microscope at 50× magnification. No striations and wind ripple defects were observed. No outgassing during the hot plate baking was observed.

What is claimed is:

1. A composition for planarizing a semiconductor device surface, the composition comprising:
   a resin, the resin consisting of a poly(methyl silsesquioxane) resin ranging from 1 wt. % to 40 wt. % of the composition, the poly(methyl silsesquioxane) resin having a weight average molecular weight between 500 Da and 5,000 Da; and
   an aminopropyltriethoxysilane salt ranging from 0.01 wt. % to 0.20 wt. % of the composition; and
   at least one solvent comprising the balance of the composition; and
   optionally, a surfactant ranging from 0.25 wt. % to 1.0 wt. % of the composition.

2. The composition of claim 1, wherein the aminopropyltriethoxysilane salt includes aminopropyltriethoxysilane triflate.

3. The composition of claim 1, wherein the at least one solvent is a solvent mixture including:
   propylene glycol methyl ether acetate; and
   n-butyl acetate, the ratio by weight of the propylene glycol methyl ether acetate to n-butyl acetate ranging from 0.5:1 to 2:1.

4. The composition of claim 3, wherein the solvent mixture further includes a high boiling point solvent ranging from 0.05 wt. % to 5 wt. % of the composition, the high boiling point solvent having a boiling point ranging from 154° C. to 274° C.

5. The composition of claim 4, wherein the high boiling point solvent includes at least one of 1-octanol, benzyl alcohol, hexyl alcohol, ethylene glycol, dipropylene glycol, dipropylene glycol methyl ether, dipropylene glycol n-propyl ether, tripropylene glycol n-butyl ether, anisole, or propylene carbonate.

6. The composition of claim 1, further comprising the surfactant.

7. The composition of claim 6, wherein the surfactant includes a polyether-modified polydimethylsiloxane surfactant.

8. The composition of claim 1, wherein the poly(methyl silsesquioxane) has a weight average molecular weight between 1,200 Da and 4,300 Da.

9. A method for making a planarizing composition, the method comprising:
   providing a resin, the resin consisting of a poly(methyl silsesquioxane) resin having a weight average molecular weight between 500 Da and 5,000 Da;
   providing one or more solvents;
   dissolving the poly(methyl silsesquioxane) resin in the one or more solvents to form a poly(methyl silsesquioxane) solution; and
   dissolving an aminopropyltriethoxysilane salt in the poly(methyl silsesquioxane) solution to form the planarizing composition.

10. The method of claim 9, wherein the aminopropyltriethoxysilane salt includes aminopropyltriethoxysilane triflate.

11. The method of claim 10, wherein providing the one more solvents includes blending together propylene glycol methyl ether acetate and n-butyl acetate, the ratio by weight of the propylene glycol methyl ether acetate ton-butyl acetate ranging from 0.5:1 to 2:1.

12. The method of claim 11, wherein providing the one or more solvents further includes blending a high boiling point solvent together with the propylene glycol methyl ether acetate and the n-butyl acetate, the high boiling point solvent having a boiling point ranging from 154° C. to 274° C.

13. The method of claim 9, further comprising dissolving a surfactant in the poly(methyl silsesquioxane) solution.

14. The method of claim 9, further comprising filtering the planarizing composition through a series of at least two 0.1 micron filters.

15. A planarizing film for a semiconductor device, the film comprising:
   a cured polymer, the cured polymer consisting of poly(methyl silsesquioxane) formed of poly(methyl silsesquioxane) polymer chains having a weight average molecular weight between 500 Da and 5,000 Da;
   a residue of an aminopropyltriethoxysilane salt; and
   optionally, a residue of a surfactant.

16. The planarizing film of claim 15, wherein
   the residue of the aminopropyltriethoxysilane salt includes a residue of aminopropyltriethoxysilane triflate.

* * * * *